United States Patent [19]

Ostman

[11] 4,357,750
[45] Nov. 9, 1982

[54] JUMPER CABLE

[75] Inventor: Barry I. Ostman, Merrimack, N.H.

[73] Assignee: Advanced Circuit Technology Inc., Nashua, N.H.

[21] Appl. No.: 786,887

[22] Filed: Apr. 12, 1977

Related U.S. Application Data

[63] Continuation-in-part of Ser. No. 697,937, Jun. 21, 1976, abandoned.

[51] Int. Cl.³ .............................................. H01R 9/07
[52] U.S. Cl. .................................. 29/847; 174/117 F; 339/17 F
[58] Field of Search ...................... 339/17 R, 17 F, 19, 339/28, 29, 176 MF; 29/625, 628, 629, 630 R, 630 A, 630 B, 847, 882, 884; 174/117 F, 117 FF, 117 PC, 68.5

[56] References Cited

U.S. PATENT DOCUMENTS

| | | | |
|---|---|---|---|
| 3,074,043 | 1/1963 | Stearns et al. | 339/17 F |
| 3,221,286 | 11/1965 | Fedde | 29/630 B |
| 3,239,798 | 3/1966 | Silver | 339/176 MP |
| 3,399,452 | 9/1968 | Reid | 29/630 B |
| 3,501,831 | 3/1970 | Gordon | 29/625 |
| 3,601,755 | 8/1971 | Shiells, Jr. | 339/19 |
| 3,731,254 | 5/1973 | Key | 339/17 F |
| 4,085,502 | 4/1978 | Ostman et al. | 339/17 F |

OTHER PUBLICATIONS

IBM Tech. Discl. Bulletin, Cable Fabrication, Davis et al., vol. 6, No. 1, 6/63, p. 8.

Primary Examiner—Neil Abrams
Attorney, Agent, or Firm—Strimbeck, Davis & Soloway

[57] ABSTRACT

An electrical jumper cable comprising a plurality of spaced metallic conductors is formed from a rigid metallic sheet by selectively reducing the sheet in cross-section so as to define conductor patterns and integral terminal ends, and to render flexible areas of the conductors. The metallic conductors are laminated to flexible insulating films which support the conductors and maintain the conductors in spaced relation to one another.

16 Claims, 21 Drawing Figures

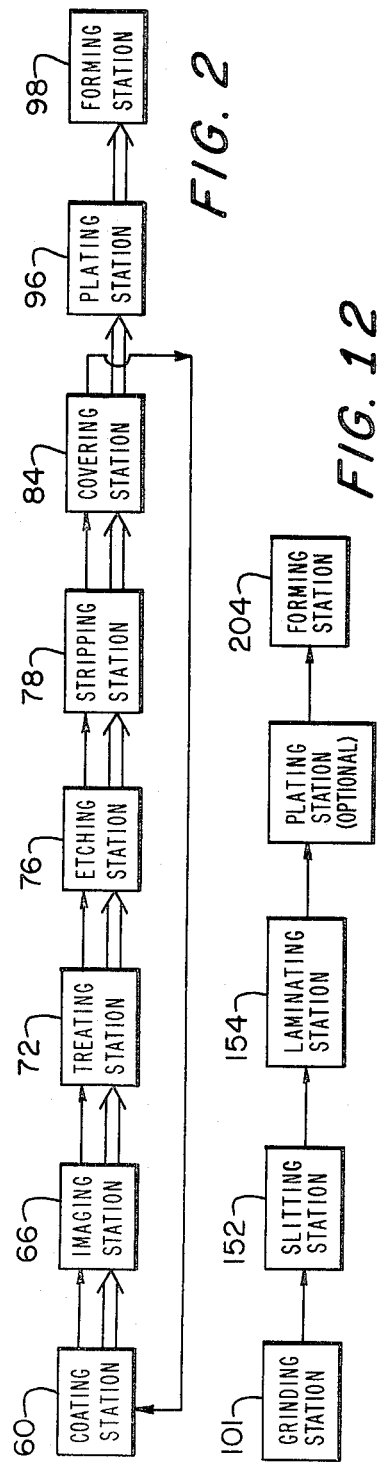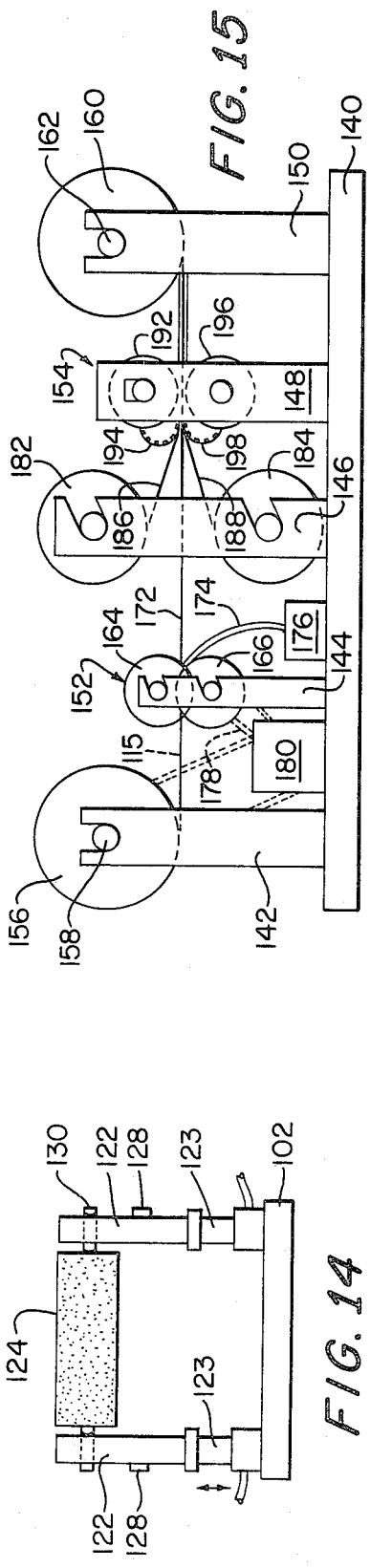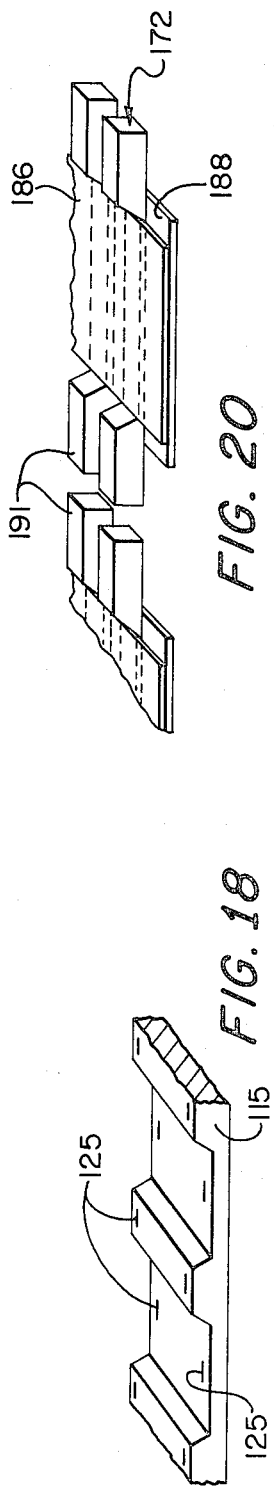

JUMPER CABLE

The present application is a continuation-in-part of my co-pending application Ser. No. 697,937, filed June 21, 1976, now abandoned.

This invention relates to electrical connecting devices and to methods of manufacturing the same, and more particularly to improvements in multiple conductor jumper cables and to methods for manufacturing the same.

Various flat multiple conductor jumper cables are well known in the art and are available commercially. At the current state of the art a principal obstacle to wide spread adoption of multiple conductor jumper cables is the relatively high manufacturing cost due primarily to direct labor costs. Another factor limiting wide spread adoption of multiple conductor jumper cables is the inability of art to simply and economically produce jumper cables to custom designs.

Shiells U.S. Pat. No. 3,601,755 proposes forming a multiple conductor jumper cable starting with conventional round wire. According to Shiells areas of the round wires between the wire ends are rolled flat so as to increase flexibility of the wires in the flattened areas, while the unflattened ends of the wires remain sufficiently strong and rigid to permit direct connection without the need of a special connector assembly. For cabling, Shiells then assembles a plurality of flattened wires in generally parallel spaced relationship and bonds the assembled wires to a plastic laminate. An obvious disadvantage of the Shiells method is the requirement of precision aligning the individual wires which may be somewhat difficult and may add appreciably to production costs. Also, contact design and conductor terminal location are severely limited by the Shiells method.

Another prior art method for forming multiple conductor jumper cables is taught by Key U.S. Pat. No. 3,731,254. Key discloses a jumper cable comprising a flat multi-conductor cable terminated at opposite ends by L-shaped stamped metal terminal posts assembled in a dielectric housing. Fabrication of the jumper cable disclosed by Key and attachment of the individual terminal posts requires a number of separate precision steps which may add appreciably to manufacturing costs. Another disadvantage of the jumper cable disclosed by Key is the possibility of failure of the connections between the conductor cable and the terminal posts.

It is thus a principal object of the present invention to provide a novel multiple conductor jumper cable having a flexible central portion and rigid terminal ends. Another object of the present invention is to provide a relatively simple and inexpensive method for producing a cable of the type above described. Yet another object of the invention is to provide a novel multiple conductor jumper cable in which the terminal ends are formed integrally with the conductor central portions, and in which the conductor and contact design and location can be custom formed. Yet other objects of the present invention will in part appear obvious and will in part appear hereinafter.

The invention accordingly comprises the process and the several steps and the relation of one or more of such steps with respect to each of the others, and the product processing the features, properties and relation of components which are exemplified in the following detailed disclosure and the scope of the invention all of which will be indicated in the claims.

Generally, in accordance with the present invention a jumper cable comprising a plurality of spaced metallic conductors including one or more flexible areas and integral rigid terminals is formed from a relatively rigid metallic sheet by selectively reducing the sheet in cross-section so as to define the conductor patterns and terminal ends, and to render flexible, (at areas of reduced cross-section), areas of the conductors. Reduction may be by chemical or mechanical milling. The metallic conductors are laminated to flexible insulating films, so as to support and maintain the metallic conductors in spaced relation to one another.

For a further understanding of the nature and objects of the present invention, reference should be had to the following detailed description taken in connection with the accompanying drawings wherein like numbers depict like parts, and:

FIG. 2 is a side elevational view, diagramatically illustrating a process for producing the jumper cable of FIG. 1 in accordance with the teachings of the present invention;

FIG. 12 is a side elevational view diagramatically illustrating an alternative and preferred process for producing the jumper cable of FIG. 1 in accordance with the teachings of the present invention;

FIGS. 13-17 are side elevational views partly in section, illustrating some of the basic elements of apparatus for performing the process of FIG. 12;

FIGS. 18-20 are perspective views of jumper cable at various stages of formation in accordance with the process of FIG. 12.

As used herein the terms "rigid" and "flexible" are employed in their relative sense and with regard to an intended utility. For example when the term "flexible" is used for describing selected areas of jumper cable in accordance with the invention, it is intended that the jumper cable have, at such areas, the capacity to be bent, or twisted within predetermined limits without fracture or fatigue. The particular circuit design will determine the required degree of flexibility. The term "rigid" as applied to the cable terminals is intended that the terminals are sufficiently stiff and rigid to permit direct assembly and connection of the terminals (e.g. as by mass wave soldering) to a circuit board.

Figure 1:
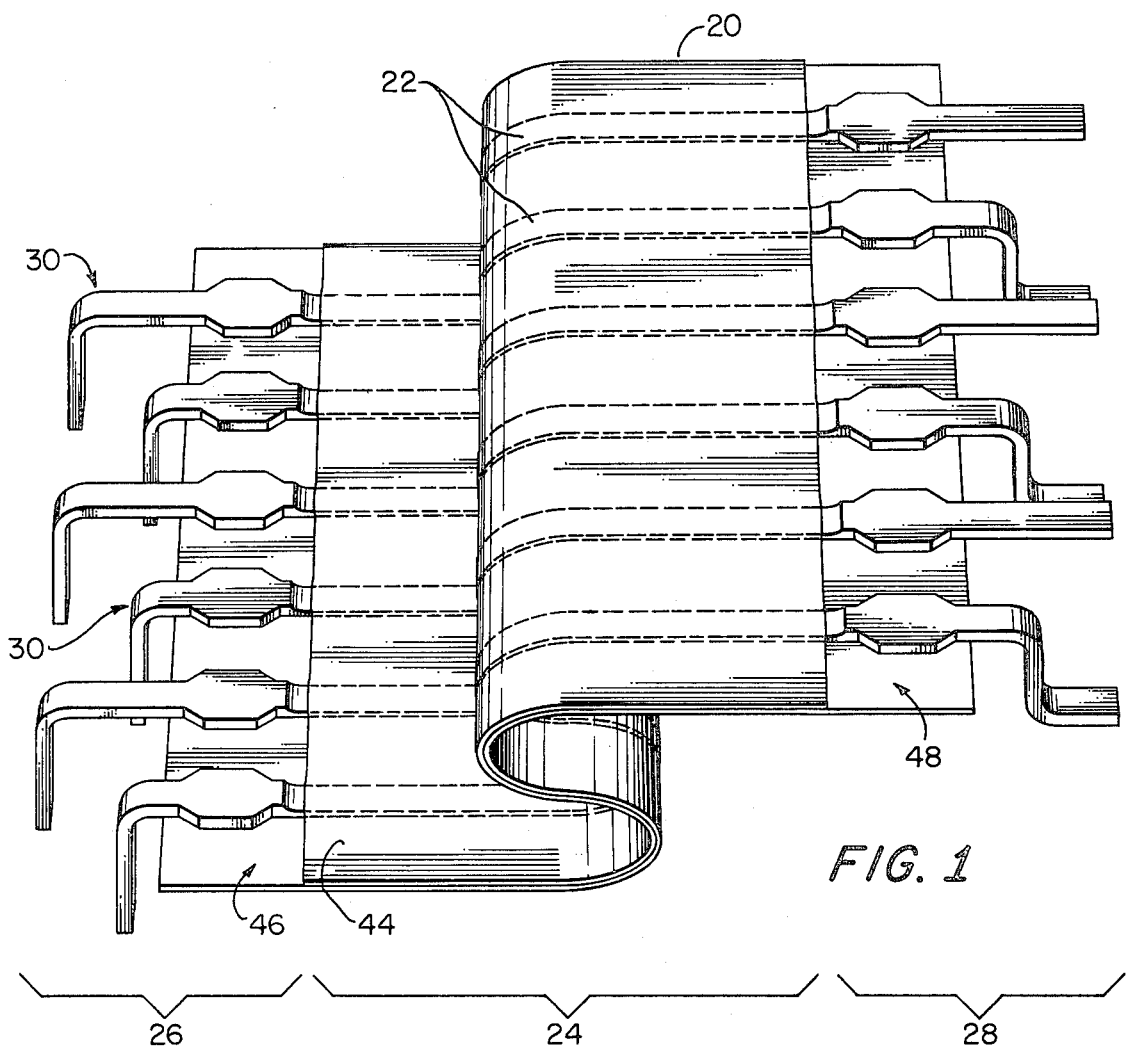
FIG. 1 is a perspective view of one form of multiple conductor jumper cable constructed in accordance with the present invention.

One embodiment of jumper cable in accordance with the present invention is shown in FIG. 1 of the drawings. Referring to FIG. 1, for illustrative purposes the jumper cable 20 is shown comprising six spaced metallic conductors 22. It will be understood however, that the jumper cable may comprise any number of conductors as may be desired. Each conductor 22 comprises a flexible central portion 24 extending between rigid terminal ends 26 and 28. Conductors 22 have dimensions, and shapes corresponding to the required design criteria, e.g. current carrying capacity, flexibility requirements, and cable geometry. Typically, those portions of conductors 22 which are intended to be flexible will have a thickness in the range of 0.03 mm. to 0.1 mm., depending on the degree of flexibility required and the hardness of the metal. Terminal ends 26 and 28 typically will have a thickness in the range of 0.2 mm. to 1.0 mm. or more, depending on the degree of stiffness required and the hardness of the metal.

Figure 21:
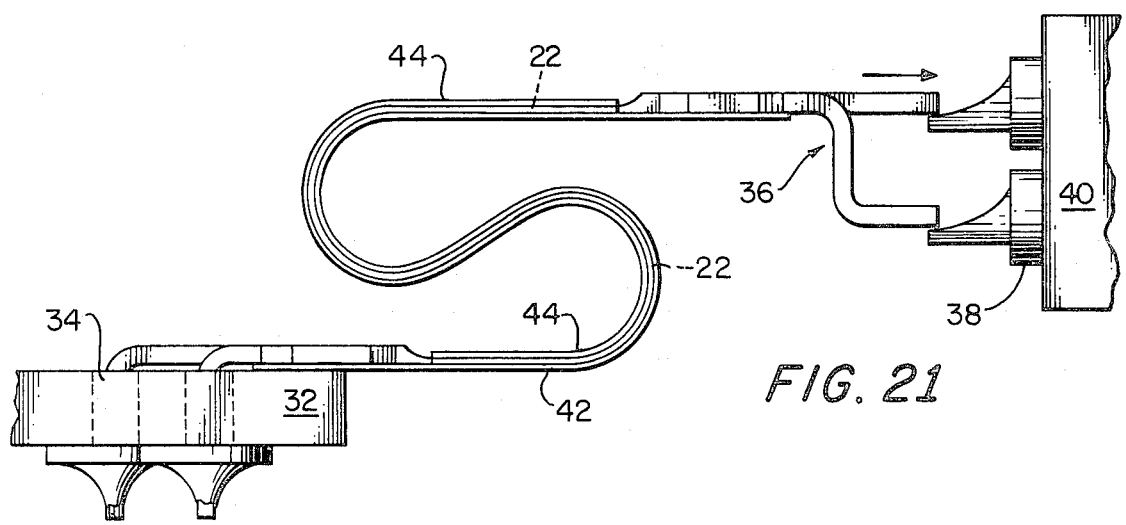
FIG. 21 is a side elevational view of a jumper cable made in accordance with the present invention, and showing exemplary modes of connection.
Figure 3:
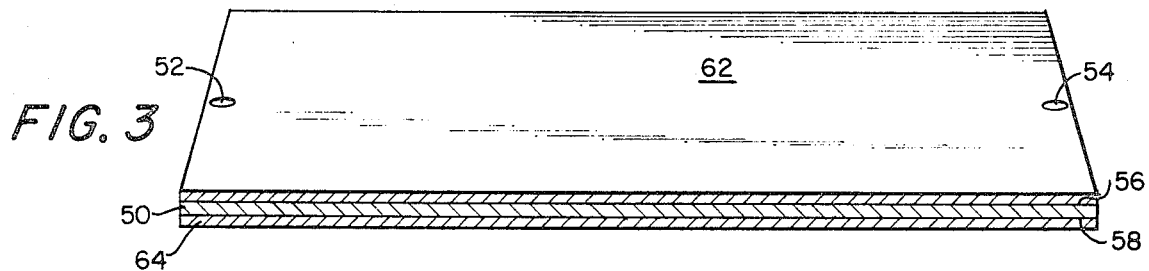
FIGS. 3-10 are perspective views of jumper cable at various stages of formation in accordance with the process of FIG. 2.
Figure 4:
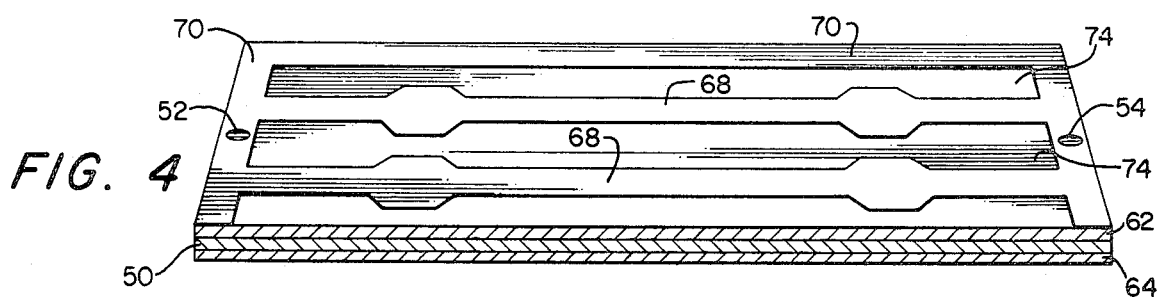

As seen in FIGS. 1 and 21, terminal ends 26 and 28 are integral extensions of the conductor central portions 24. Terminal ends 26 and 28 may be formed or shaped for the particular connection purpose required. Thus for example, terminal ends 26 may be bent at right angles at 30 for insertion into apertures 34 in a circuit board 32, while terminal ends 28 may be bent and formed as at 36 for connection to solder cups 38 of connector 40 (FIG. 21). Preferably the terminals are offset from one another as shown so as to provide greater isolation between adjacent connection points. Obviously terminal ends 26 and 28 will be sized and spaced to meet design criteria for custom application or for mating with standard terminal connectors. The manner by which the terminal ends are formed will be described in detail hereinafter.

The individual conductors 22 are supported and maintained in spaced relation to one another by sandwiching the conductors 22, between first and second dielectric films 42 and 44, respectively. As seen in FIG. 2, film 42 is bonded to the bottom surface of conductors 22, and preferably also extends partially under the terminal ends, e.g. as at 46 and 48. Film sheet 44 is bonded across the top surface of conductors 22, and preferably extends to and may cover the terminal ends (46, 48). Films 42 and 44 are also bonded to each other in the areas between conductors 22. Films 42 and 44 preferably are formed of an electrically insulating polymeric film material such as a polyester, polypropylene, polyimide, cellulose triacetate, polyethylene terephthalate or other readily available flexible film. The film thickness is not critical to the invention and will depend upon the particular film or films employed, required degree of flexibility and electrical insulation requirements. Films 42 and 44 may be bonded to conductors 22 by adhesive means such as a thermoplastic or thermosetting adhesive, or one or both of films 42 and 44 may be formed in-situ on the conductors as by casting in known manner, as will be described in detail hereinafter.

The present invention is predicated in part on mass forming a plurality of metallic conductors from a metallic sheet by selectively reducing the sheet in cross-section so as to define the conductor patterns, areas of relative flexibility and integral rigid terminal ends. The metallic sheet may be reduced by chemical milling, e.g. etching, or by mechanical milling, e.g. grinding or skiving, precision rolling, precision die flattening and cutting, or a combination of one or more milling, etc. techniques.

One method of forming a flexible jumper cable in accordance with the present invention is described below:

FIGS. 2-10 illustrate the formation of a flexible jumper cable in accordance with the present invention employing chemical milling techniques.

A metallic sheet 50 preferably of a thickness substantially equal to that required for the terminal ends of the completed cable is provided. In the illustrated case the metallic sheet comprises 0.25 mm. thick cooper. Thereafter as shown in FIG. 2 a plurality of registration holes (52 and 54) are formed at spaced positions in the sheet. The purpose of registration holes 52 and 54 will become clear from the description following. The next step involves coating the metallic sheet top and bottom surfaces 56 and 58, at a coating station 60 (FIG. 2) with conventional acid resist materials 62 and 64, respectively. Then one side of the sheet (e.g. top side 56 and layer 62) is exposed, at an imaging station 66, to a negative artwork image of the desired conductor pattern 68 and also including a border area 70 at the edges of the sheet (see FIG. 4). This artwork is registered to the metallic sheet using registration holes 52 and 44. Simultaneously layer 64 is entirely exposed to light at imaging station 66. Those areas of resist coating 62 and 64 exposed to light are altered to a lower molecular weight polymer. The purpose of border area 70 will become clear from the following description. The sheet is then immersed in a preferential solvent and developed at a treating station 72, with the result that the exposed bottom resist layer 64, and the exposed portions of resist layer 62 (i.e. the conductor pattern 68 and border area 70) remain intact while the unexposed areas 74 are dissolved away leaving a resist layer 62 in positive image of the desired conductor pattern 68 and border area 70.

The next step involves chemically milling the exposed metallic areas by contacting sheet 50 with an acid etching solution at an etching station 76. Etching is controlled so as to remove metal to a depth which substantially equals that desired for the flexible central portions 24 of the conductors. For example, if 0.075 mm. thick flexible conductors are desired, etching should be controlled to a depth of 0.075 mm. Spray etching has been found to be especially suitable for obtaining precision control of the etching step.

Figure 5:
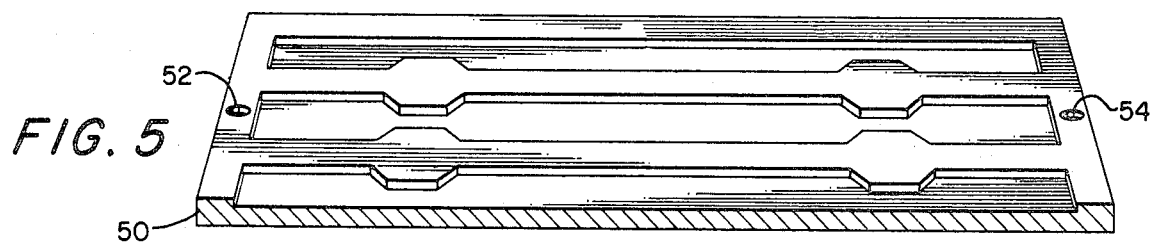

Thereafter, the sheet is treated in a stripping station 78 wherein the acid resist remaining on the sheet is removed from both sides of the sheet. The resulting sheet appears substantially as shown in FIG. 5.

Figure 6:
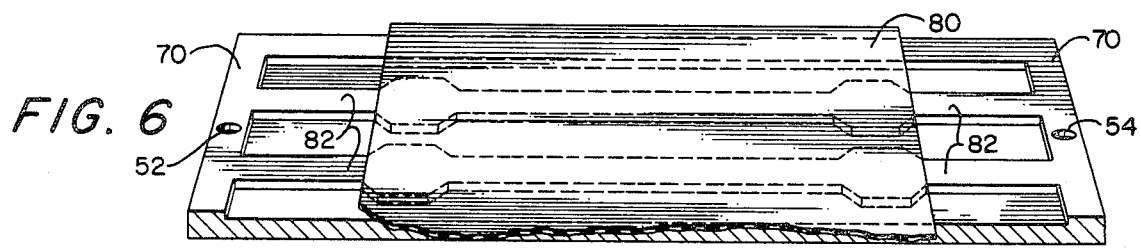

The next step is to partially cover the etched side of metallic sheet 50 with a thin, flexible insulating film such as 3 mil polyimide film 80. As shown in FIG. 6, film 80 is cut to a size and shape so as to cover the central conductor areas of sheet 50, but leaving uncovered end portions 82 of the conductors and the border areas 70. Film 80 is applied to sheet 50 at covering station 84 (FIG. 2), and the film is bonded to the metallic sheet by means of a suitable adhesive such as a thermoplastic or thermosetting adhesive.

Figure 7:
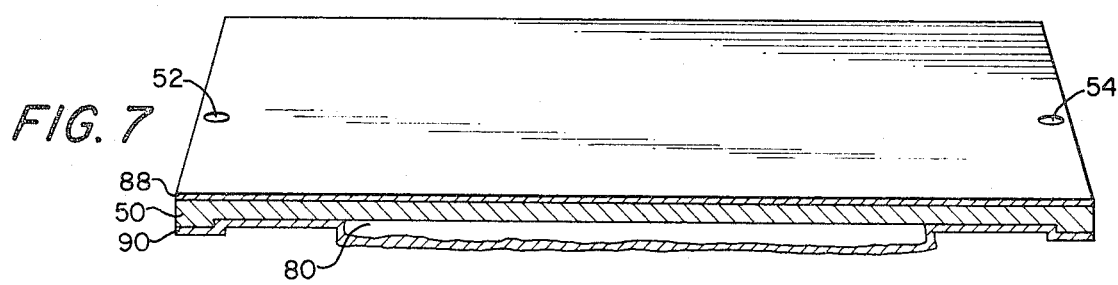
Figure 8:
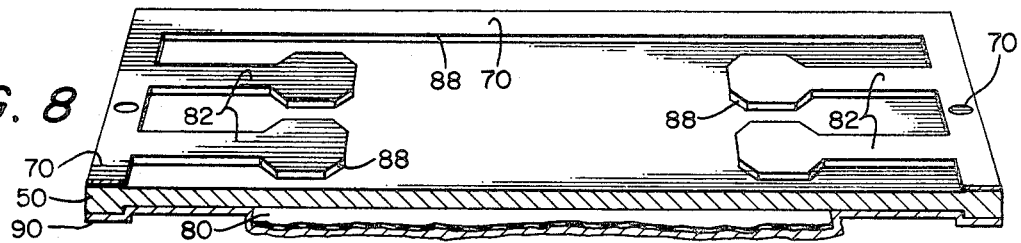

Metallic sheet 50 is then turned over, and the sheet returned to coating station 60 where the sheet surfaces 56 and 58 (and film 80) are covered with layers of conventional resist material 88, 90 (FIG. 7). Then, using registration holes 52, 54 to insure front-to-back image registration, resist layer 88 is exposed to a negative artwork pattern redefining the conductor end portions 82 and border area 70. However, the central areas of the conductor pattern are not redefined in this imaging step. The sheet is then treated in treating station 72, with the result that exposed portions of the resist layers 88, 90 remain intact while the unexposed areas are dissolved away as before. The resulting structure appears substantially as shown in FIG. 8.

Figure 9:
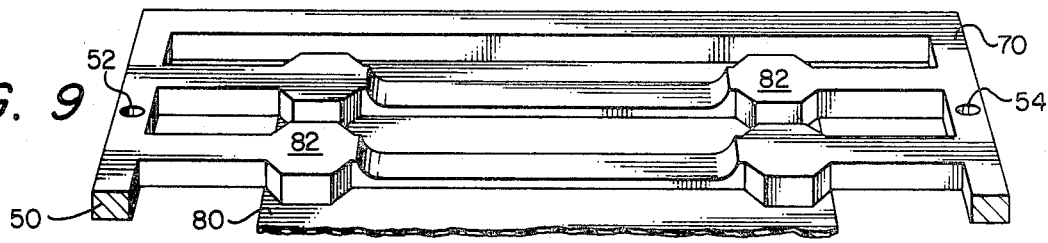

Sheet 50 is then chemically milled in etching station 76 as before, until breakthrough occurs. This should occur at a depth of 0.175 mm. using the exemplary panel thickness and first etch depth given above. At this point the conductor patterns and the relative thicknesses of the conductor flexible central portions and rigid terminal ends are determined. Both sides are next stripped of all resist at station 78. The resulting sheet appears substantially as shown in FIG. 9.

Figure 10:
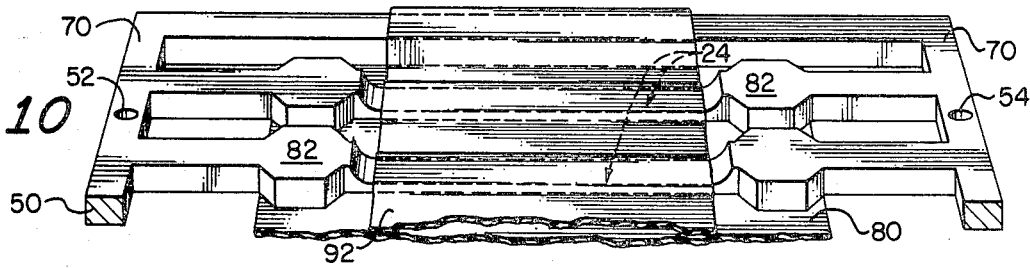

As depicted in FIG. 10, a thin insulating film such as 3 mil polyimide film 92 is then cut to size and shape and placed in the cavity defined by end portions 82, at covering station 84. Film 92 is then adhesively bonded in known manner to the conductor central portions, and to film 80. As seen in FIG. 10, the resulting structure is a copper panel comprising a plurality of spaced conductors including relatively thin central portions 24 and relatively thick end portions 82 joined at a relatively thick common border 70, and with the central portions 24 laminated between a pair of thin films 80, 92.

Figure 11:
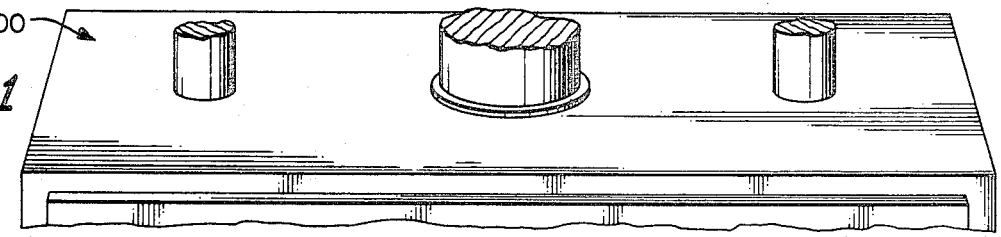
FIG. 11 is a perspective view of basic elements of a forming press useful in practicing the process of FIG. 2.

At this point the exposed copper preferably is plated at a plating station 92 with a tin/lead alloy or a precious metal, using border 70 as a common bus bar. Thereafter, using border 70 for support and registration, the resulting structure is passed to a forming station 98 where end portions 82 are cut free from border 70, and the end portions 82 shaped for the desired connection purpose by means of a forming press 100 (FIG. 11). The resulting structure is a multiple conductor jumper cable. It is to be understood that while only two conductors are depicted in the foregoing processing figures, sheet 50 may have a width suited to provide several jumper cables of a given number of conductors. Thus, for example, a hundred conductor wide structure can be produced for cutting, for example, into twenty jumper cables of five conductors each.

An alternative method and apparatus for producing multiple conductor jumper cable in accordance with the present invention is shown in FIGS. 12-20. The embodiment of FIGS. 12-20 is predicated upon the use of mechanical milling techniques for selectively reducing a metallic sheet to define the conductor patterns and thickness.

Figure 13:
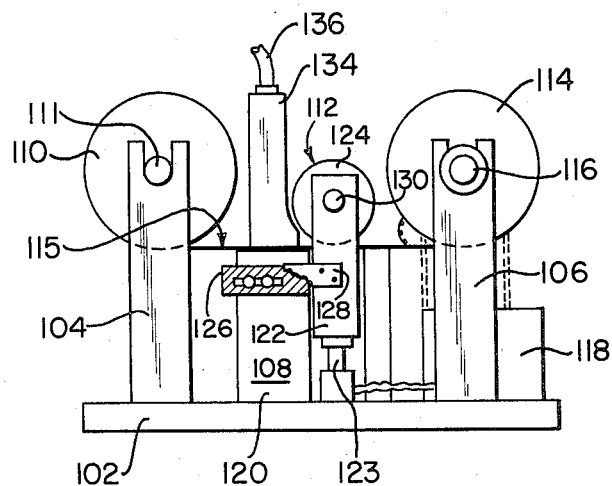

Referring to FIGS. 12-17, the illustrated process basically comprises a three-step roll-to-roll manufacturing process. The first step involves selectively thinning a roll of metal by grinding the surface of the metal in a grinding station 101. Referring in particular to FIGS. 13-14, grinding station 101 comprises a frame in the form of a horizontal base 102, generally vertical paired side members 104 and 106 (only one of each pair is shown) and a grinder frame member 108 disposed on base 102 between members 104 and 106. Disposed within the frame are a supply reel 110, precision grinding means indicated generally at 112, and first recovery reel 114.

As seen in FIG. 13, supply reel 110 is disposed on vertical side members 104 for rotation on a horizontal shaft 111. The latter is supported by members 104 and known bearing means. An elongated strip 115 of metal, e.g. copper, is carried on reel 110. Strip 115 is threaded through grinding means 112 to first recovery reel 114. The latter is supported on a horizontal shaft 116 side members 106 and known bearing means. Supply reel 110 is mechanically coupled to a drag means (not shown) while first recovery reel 114 is mechanically coupled via a suitable drive and transmission (not shown) to an electrical motor 118.

Grinder frame 108 comprises a main support base 120 fixedly attached to base 102 and a moveable support 122 disposed adjacent main support 120. Moveable support 122 is adapted for vertical movement between (1) a first raised position in which a grinding wheel 124 carried by support 122 is disposed vertically above copper sheet 115, and (2) a second lowered position in which the grinding wheel 124 is in contact with copper sheet 115. The lower limit of movement of support 122 is controlled by adjustable limit means 126 and 128 mounted on supports 120 and 122 respectively. Moveable support 122 in turn is mounted on hydraulic actuatable support piston 123. Grinding wheel 124 is mounted for rotation on a horizontal shaft 130. The latter is supported by support 122, and is mechanically coupled through a suitable drive and transmission (not shown) to motor 118.

Completing grinding station 101 is a vacuum scavenger 134 for collecting metallic fines produced in the grinding operation. Vacuum scavenger 134 is hydraulically connected via a vacuum hose 136 to a vacuum means (not shown).

Operation of the grinding station is as follows:

A roll of copper 110 is placed in the feed position in the grinding apparatus. The copper provided has a thickness substantially equal to the thickness desired for the terminal ends of the jumper cables to be produced. The copper strip 115 is threaded through the apparatus under grinding wheel 124 to recovery reel 114. Grinding means 112 is adjusted for vertical movement between an upper position in which grinding wheel 124 is disposed vertically above the copper strip 115 under the wheel, and a lowered position in which the grinding wheel will cut into the copper strip 115 to a depth so as to leave a thickness of copper (following grinding) substantially equal to the thickness desired for the flexible areas of the conductors being produced. For example, for producing jumper cables having rigid terminals of about 0.25 mm. thickness and flexible areas of about 0.075 mm. thickness, copper strip 115 should have a thickness prior to grinding of about 0.25 mm. and the ground areas should be reduced by grinding to about 0.075 mm.

Once adjusted, the grinding apparatus is activated, and a metered length of copper strip 115 is pulled through the apparatus by recovery reel 114. Metering may be by any linear measuring means known in the art. Preferably, however, one or both side edges of copper strip 115 will be provided with spaced slots 125 (FIG. 18) for engaging with metering sprockets (not shown) on the grinding apparatus. Grinding wheel 124 is then lowered so as to cut into strip 115. Once wheel 124 reaches its lower limit of travel recovery reel 114 is again activated so as to pull a predetermined length of copper under grinding wheel 124. This results in removal of a predetermined thickness of copper along a predetermined length of strip 115. Grinding wheel 124 then is raised to its upper limit of travel, and the copper strip 115 is advanced a predetermined length by rolling onto recovery reel 114, and the grinding cycle repeated. The copper is rewound on recovery reel 114 roll in preparation for the next processing step. The copper strip after this first processing step appears substantially as shown in FIG. 18 of the drawings.

The next processing step is designed to produce the circuit pattern by defining the individual conductor width and spacing between the various conductors.

Figure 16:
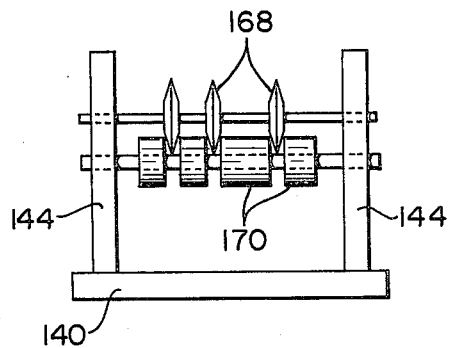
Figure 17:
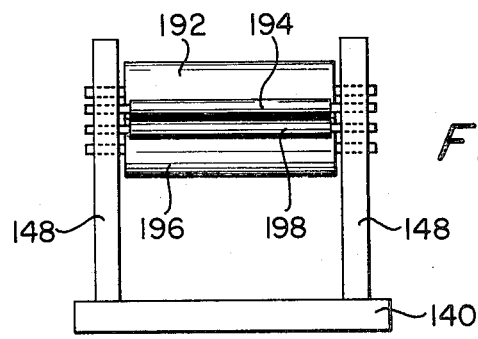

In accordance with the invention, the copper strip from the first processing step is then slit lengthwise so as to form the individual conductors, and the conductors are then laminated between flexible films. These operations are accomplished in apparatus which in a preferred form as shown in FIGS. 15-17 comprises a frame having a horizontal base 140, and generally vertical paired frame side members 142, 144, 146, 148 and 150 (only one of each pair as shown). Disposed within the frame are a slitting station 152 and a laminating station indicated generally at 154.

Referring in particular to FIG. 15, a supply reel 156 is disposed adjacent the top ends of frame members 142 for rotation on a horizontal shaft 158. (Supply reel 156 constitutes recovery reel 114 from the previous processing step). A take-up reel 160, is mounted adjacent the top ends of frame members 150. Reel 160 is mounted for rotation on a horizontal shaft 162.

The sheet slitting means comprise a pair of opposed cutting wheels 164 and 166, respectively, including a plurality of engaged male and female cutting dies 168 and 170, respectively (see FIG. 16). Cutting dies 168 and 170 are adapted so as to allow portions 172 of the copper strip (i.e. the intended circuit conductors) to pass untouched, while shearing out material between the conductors as waste 174 (see FIG. 19). The latter is collected in a waste collector 176. One or both cutting wheels 164 and 166 are mechanically connected through a drive 178 to a motor 180. Cutting dies 168 and 170 are adapted for adjustment so as to provide a predetermined number of conductors 172 of predetermined width and spacing.

Figure 19:
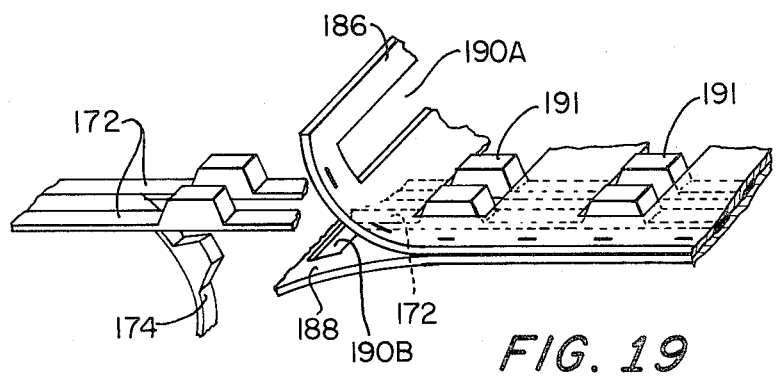

The laminating station 154 includes upper and lower film dispenser means 182 and 184, respectively. The latter are in the form of reels each containing a supply of flexible dielectric film 186 and 188, (e.g. 3 mil polyimide film). Referring in particular to FIG. 19, upper film 186 and lower film 188 each comprise an elongate pre-windowed continuous strip, of width slightly greater than the combined width of spaced conductors 172. Both films 188 and 186 include a plurality of pre-punched slots 190A and 190B for mating the pre-windowed film with the flexible areas 172 of the copper conductors. Completing the laminating station are a plurality of opposed laminating rollers 192, 196, and 194, 198, respectively. One or more of the aforesaid rollers may be driven by suitable means known in the art.

In operation, the reel of copper from the first processing step (reel 114) is placed in the supply reel position of the slitting and laminating apparatus. The copper strip 115 is threaded through the apparatus to the recovery reel 160. Cutting wheels 164 and 166 (which had been previously adjusted to define desired conductor width and conductor spacing) are then closed so as to pierce the copper strip. The copper strip is then advanced through slitting station 152 and into laminating station 154. It should be noted that strip 115 and the individual conductors 172 are maintained under tension between reels 156 and 160 throughout the slitting step and also during the laminating step.

The laminating step is an extension of the cutting step. The slit, i.e. free floating conductors are held in tension between reels 156 and 160 and passed between the pre-punched upper laminating film 186 and pre-punched lower laminating film 188. Upper laminating film 186 and lower laminating film 188 is aligned with the conductors 172 so that the flexible areas 172 of conductors are registered intermediate slots 190 leaving the thick area 191 completely free of film. The conductors and insulating films are passed between heated nip laminating rollers 192, 196 and 194, 198, respectively, where the insulating films (which had been previously coated with a thermal setting adhesive) are bonded to the conductors, and each other. The resulting structure is a elongate series of spaced copper conductors 172 having bare raised "finger areas" 191 laminated between dielectric films 186 and 188 as shown in FIG. 19.

Final processing involves passing the FIG. 19 structure to an end forming station 204 where the structure is cut mid-way of the finger areas 191 (see FIG. 20), and end shaping will be performed simultaneously as before, by means of an forming press, e.g. press 100, (FIG. 11).

If desired the finger areas 191 may be preplated in known manner to improve solderability prior to final cutting and forming.

One skilled in the art will recognize a number of advantages the present invention has over the prior art. For example, the invention permits relatively inexpensive mass production of custom designed jumper cables, if desired having random conductor location and varying conductor size (and thus current carrying capacity), and varying terminal size and shape. Moreover, the jumper cable rigid terminal ends are formed integrally with the conductor flexible areas. Thus problems normally associated with attaching terminal ends, and failure in the field, are eliminated.

Certain changes may be made in the above apparatus and process without departing from the scope of invention herein as will be obvious to one skilled in the art. For example, precision die flattening and cutting techniques are known per se in the art and may be adopted for defining the conductor spacing and thickness. Moreover, one skilled in the art will appreciate that it is possible to start with a metallic sheet somewhat thinner than desired for the terminal ends. Processing will be as before except preplating will be used not only to improve solderability, but also to deposit sufficient metal to achieve desired terminal thickness. Still other changes will be obvious to one skilled in the art, and it is therefore intended that all matter contained in the above description shall be interpreted in an illustrative and not in a limiting sense.

What is claimed is:

1. A method of forming a jumper cable having a plurality of spaced metallic conductors, each of said conductors including a pair of spaced, relatively rigid ends, and at least one region of relative flexibility between said ends and integral therewith, wherein said ends (1) are generally flat, (2) are thicker in cross-section than said at least one region of flexibility, and (3) derive their relative rigidity be virtue of their relative thicker cross-section, said method comprising the steps of:
    (A) providing a relatively rigid metallic sheet of a cross-section thickness substantially equal to that required for said rigid ends;
    (B) selectively reducing portions of said metallic sheet in cross-section so as to (i) increase the relative flexibility of said sheet at said region, and (ii) define in situ a plurality of spaced conductors; and
    (C) covering said spaced conductors at least in part with a flexible insulating material while maintaining said conductors in spaced relation to one another.

2. A method according to claim 1, wherein said sheet comprises a metal selected from the group consisting of copper and alloys in which copper is a major constituent, and said selective reducing is by chemical milling.

3. A process according to claim 1 wherein said metallic sheet material comprises a metal selected from the group consisting of copper and alloys in which copper is a major constituent, and said selective reducing is by mechanical milling.

4. A method according to claim 1 wherein said sheet is selectively reduced in two chemical milling steps and comprising first chemically milling said sheet so as to remove metal from selected portions on one side of said sheet to a first partial depth so as partially to define a pattern of leads and terminals; bonding a first insulating sheet to said one side; removing metal from selected portions on the opposite side of said sheet until break-through occurs, leaving a plurality of flexible leads terminating with rigid terminals; and bonding a second insulating sheet to said opposite side.

5. A method according to claim 2 including the step of masking selected portions of said sheet so as to prevent chemical milling at said masked areas.

6. A method according to claim 5 including the step of plating exposed portions of said ends so as to increase the thickness of said ends and therefore the relative rigidity thereof, and to improve electrical conductivity of said ends.

7. A method of forming a jumper cable having a plurality of spaced metallic conductors, each of said conductors including a pair of spaced, relatively rigid terminal ends, and at least one region of relative flexibility between said ends and integral therewith, wherein said ends (1) are generally flat, (2) are thicker in cross-section than said at least one region of relative flexibility, and (3) derive their relative rigidity by virtue of their relative thicker cross-section, said method comprising the steps of:
(A) providing a metallic sheet of a cross-section thickness substantially equal to that required for said rigid ends;
(B) selectively reducing said sheet in cross-section so as to define in situ a plurality of spaced conductors having ends of approximately said sheet thickness, and flexible central regions of relatively reduced thickness; and
(C) laminating said conductors between a pair of flexible insulating films so as to support and maintain said conductors in spaced relation to one another.

8. A method according to claim 7 including the step of shaping the ends of said conductors.

9. A method of forming a jumper cable having a plurality of spaced metallic conductors, each of said conductors including a pair of spaced, relatively rigid ends, and at least one region of relative flexibility between said ends and integral therewith, wherein said ends (1) are thicker in cross-section than said at least one region of flexibility, and (2) derive their relative rigidity by virtue of their relative thicker cross-section, said method comprising the steps of:
(A) providing a relatively rigid metallic sheeet of a cross-section thickness substantially equal to that required for said rigid ends;
(B) chemically milling said metallic sheet to (i) increase the relative flexibility of said sheet at said portion, and (ii) define in situ a plurality of spaced conductors, said chemical milling involving:
first chemically milling said sheet so as to remove metal from selected portions on one side of said sheet to a first partial depth so as partially to define in situ a pattern of leads and terminals; bonding a first insulating sheet to said one side; removing metal from selected portions on the opposite side of said sheet until break-through occurs, leaving a plurality of flexible leads terminating with rigid terminals; and bonding a second insulating sheet to said opposite side.

10. A method according to claim 9 including the step of masking selected portions of said sheet so as to prevent chemical milling at said masked areas.

11. A method according to claim 10 including the step of plating exposed portions of said ends so as to increase the thickness of said ends and therefore the relative rigidity thereof, and to improve electrical conductivity of said ends.

12. A method of forming a jumper cable having a plurality of spaced metallic conductors, each of said conductors including a pair of spaced, relatively rigid terminal ends, and at least one region of relative flexibility between said ends and integral therewith, wherein said ends (1) are generally flat, (2) are thicker in cross-section than said at least one region of relative flexibility, and (3) derive their relative rigidity by virtue of their relative thicker cross-section, said method comprising the steps of:
(A) providing a metallic sheet of a cross-section thickness substantially equal to that required for said rigid ends;
(B) selectively reducing said sheet in cross-section so as to define in situ a plurality of spaced conductors having (1) ends of approximately said sheet thickness, (2) flexible central regions of relatively reduced thickness, and (3) a stabilizing border for temporarily maintaining said conductors in spaced relation;
(C) laminating said conductors between a pair of flexible insulating films so as to support and maintain said conductors in spaced relation to one another; and
(D) treating the laminate resulting from step (C) so as substantially simultaneously to remove said stabilizing border and to shape said terminal ends.

13. A method according to claim 12 wherein said selective reducing is by mechanical milling.

14. A method according to claim 12 wherein said selective reducing is by chemical milling.

15. A method according to claim 14 including the step of masking selected portions of said sheet so as to prevent chemical milling at said masked areas.

16. A method according to claim 12 including the step of plating exposed portions of said ends so as to increase the thickness of said ends and therefore the relative rigidity thereof, and to improve electrical conductivity of said ends.

* * * * *